US012645159B2

(12) United States Patent
Chen et al.

(10) Patent No.: US 12,645,159 B2
(45) Date of Patent: Jun. 2, 2026

(54) EXHAUST DISCHARGING DEVICE WITH TEMPERATURE CONTROL AND HEAT RETENTION MECHANISM FOR PREVENTING PHOTORESIST FROM CRYSTALLIZATION AND ADHERING TO PIPES, AND EXHAUST DISCHARGING METHOD USING THE SAME

(71) Applicant: CHYI DING TECHNOLOGIES CO., LTD., Hsinchu County (TW)

(72) Inventors: Shih-Chia Chen, Hsinchu County (TW); Kuan-Hung Cho, Hsinchu County (TW); Wei-Long Chen, Hsinchu County (TW)

(73) Assignee: CHYI DING TECHNOLOGIES CO., LTD., Hsinchu County (TW)

( * ) Notice: Subject to any disclaimer, the term of this patent is extended or adjusted under 35 U.S.C. 154(b) by 166 days.

(21) Appl. No.: 18/673,341

(22) Filed: May 24, 2024

(65) Prior Publication Data

US 2025/0004389 A1 Jan. 2, 2025

(30) Foreign Application Priority Data

Jun. 5, 2023 (TW) ................................ 112120884

(51) Int. Cl.
*G03F 7/00* (2006.01)
(52) U.S. Cl.
CPC ...... *G03F 7/70933* (2013.01); *G03F 7/70858* (2013.01); *G03F 7/7095* (2013.01)

(58) Field of Classification Search
CPC . Y02T 10/12; Y02A 50/20; F01N 2610/1406; F01N 3/08; F01N 3/20;
(Continued)

(56) References Cited

U.S. PATENT DOCUMENTS 5,577,552 A * 11/1996 Ebinuma ................. G03F 7/707
165/104.32
6,226,073 B1 * 5/2001 Emoto ..................... H02K 3/24
378/34
(Continued)

FOREIGN PATENT DOCUMENTS

CN 105446081 A 3/2016
CN 215822587 U 2/2022

*Primary Examiner* — Deoram Persaud

(57) ABSTRACT

An exhaust discharging device with a temperature control and heat retention mechanism for preventing photoresist from crystallization that causes duct adhesion and its exhaust discharging method involve a flow guiding portion, a flow control portion and an out-flowing gas guiding portion. Photoresist-containing exhaust is guided into the flow guiding portion, and undergoes flow division twice. After the temperature of the flow guiding portion, flow control portion and out-flowing gas guiding portion are directly or indirectly increased, the environmental temperature in their ductway is in a first temperature range, second temperature range and third temperature range, respectively. The heat retention material layer of the out-flowing gas guiding portion blocks thermal conduction with the outside. During the exhaust discharging process, the temperature ranges can be kept above the boiling point of the exhaust, effectively preventing photoresist from forming crystals and preventing crystals from adhering to the ductway.

7 Claims, 5 Drawing Sheets

(58) Field of Classification Search
CPC .............. F01N 3/2066; G03F 7/70858; G03F
7/70933; G03F 7/7095
See application file for complete search history.

(56)                    References Cited

U.S. PATENT DOCUMENTS

| 8,629,970 | B2 * | 1/2014 | Sewell | ................ | G03F 7/70341 |
| | | | | | 355/77 |
| 9,811,007 | B2 * | 11/2017 | Van Boxtel | ......... | G03F 7/70991 |
| 2006/0180175 | A1 * | 8/2006 | Parent | .................... | G01N 21/53 |
| | | | | | 118/50.1 |
| 2015/0270119 | A1 * | 9/2015 | Yahata | ................ | H01J 37/3244 |
| | | | | | 438/758 |

* cited by examiner

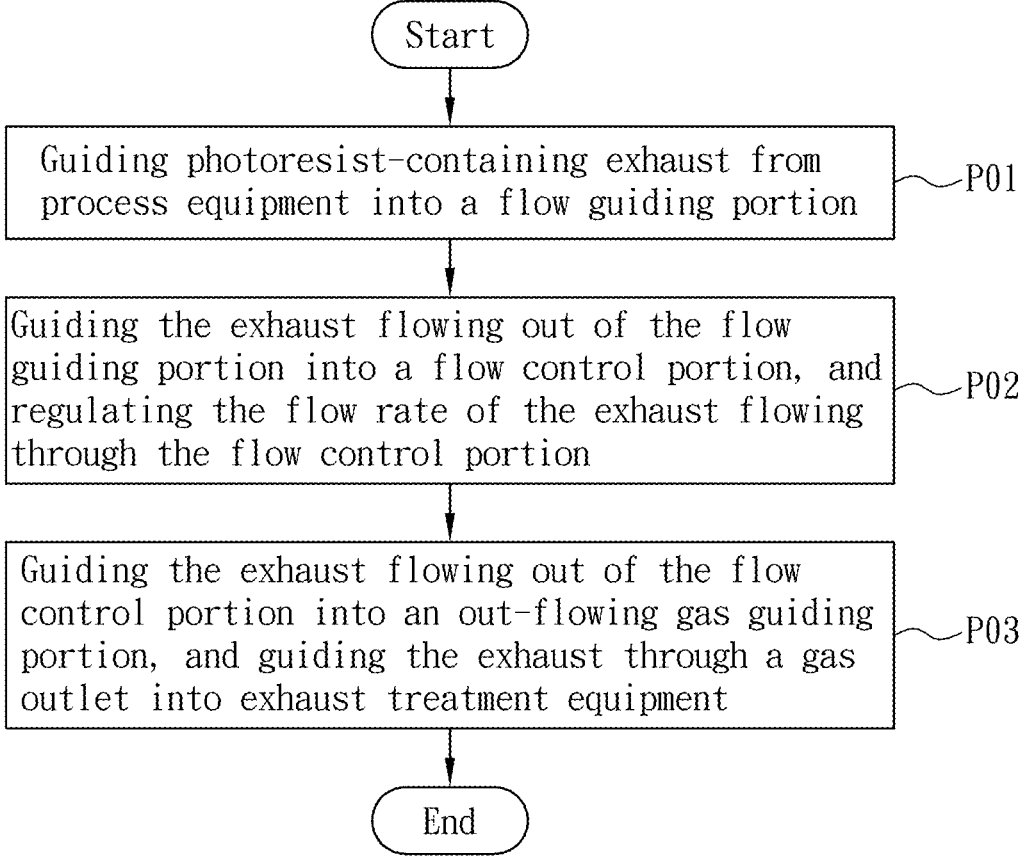

Start

Guiding photoresist-containing exhaust from process equipment into a flow guiding portion    ~P01

Guiding the exhaust flowing out of the flow guiding portion into a flow control portion, and regulating the flow rate of the exhaust flowing through the flow control portion    ~P02

Guiding the exhaust flowing out of the flow control portion into an out-flowing gas guiding portion, and guiding the exhaust through a gas outlet into exhaust treatment equipment    ~P03

End

FIG. 4

EXHAUST DISCHARGING DEVICE WITH TEMPERATURE CONTROL AND HEAT RETENTION MECHANISM FOR PREVENTING PHOTORESIST FROM CRYSTALLIZATION AND ADHERING TO PIPES, AND EXHAUST DISCHARGING METHOD USING THE SAME

CROSS-REFERENCE TO RELATED PATENT APPLICATION

This non-provisional application claims priority to and the benefit of, under 35 U.S.C. § 119(a), Taiwan Patent Application No. 112120884, filed Jun. 5, 2023 in Taiwan. The entire content of the above identified application is incorporated herein by reference.

FIELD

The present disclosure is related to an exhaust discharging device and its exhaust discharging method, and particularly to an exhaust discharging device with a temperature control and heat retention mechanism for preventing photoresist from crystallization that causes duct adhesion, and its exhaust discharging method.

BACKGROUND

In a wafer manufacturing process, photoresist is a key material used in the process of photolithography. 80% or more of photoresist is organic solvents, for example, chemical ingredients such as propylene glycol methyl ether (PGME), 1-methoxy-2-propanol acetate (PGMEA), ethyl lactate, polymer solids, photosensitizers, additives, etc. The boiling point of the aforementioned organic solvent(s) is about 120° C. or more. When photoresist is coated on a wafer and undergoes soft bake and hard bake processes, a large amount of exhaust is generated due to the volatilization of organic solvents. Most of the aforementioned exhaust will enter a piece of tail gas equipment through the exhaust discharging pipe of a negative pressure system for centralized treatment. However, during the discharge process, when the exhaust containing the photoresist component contacts the wall of the exhaust pipe and cools down and condenses, viscous crystals will be produced in the system. In the long run, this will cause the pressure loss in the entire exhaust discharging system to rise sharply, causing abnormality in exhaust discharging and producing gaseous molecular pollutants in the environment of wafer production equipment, thereby affecting the yield of wafer production.

In order to reduce the aforementioned adverse effects, some negative-pressure-system exhaust discharging devices perform heating in the front-section flow-guiding area. However, this design still does not help solve the crystallization problem in the middle and rear sections (such as the middle adapter area and the rear transverse exhaust-extracting duct area). In addition, since there is no real-time temperature monitoring function at the end of the system, reference data useful for preventing crystallization cannot be collected.

SUMMARY

In view of the conventional problem of tail gas crystallization, as a result of repeated research and test, an exhaust discharging device with a temperature control and heat retention mechanism for preventing photoresist from crystallization that causes duct adhesion and its exhaust discharging method are provided in the present disclosure, so as to effectively solve conventional problems, and provide manufacturers and/or installation personnel with better operation and/or use experience.

Certain aspects of the present disclosure are directed to an exhaust discharging device with a temperature control and heat retention mechanism for preventing photoresist from crystallization that causes duct adhesion. The exhaust discharging device includes a flow guiding portion, a flow control portion, and an out-flowing gas guiding portion. The flow guiding portion is connectable to and communicatable with a piece of process equipment, is made of a good conductor of heat, is for photoresist-containing exhaust to be guided from the process equipment into the ductway of the flow guiding portion, and includes a first flow guiding member, a second flow guiding member, a third flow guiding member and at least one first temperature increasing member. The first flow guiding member has a first flow guiding hole set for the exhaust to flow therethrough. The second flow guiding member has a plurality of rows of second flow guiding hole sets along a vertical-axis direction for the exhaust to flow therethrough to undergo the first division. The third flow guiding member has a third flow guiding hole set and a fourth flow guiding hole set. The third flow guiding hole set is spaced apart from the fourth flow guiding hole set with a distance, and the exhaust flows through the third flow guiding hole set and the fourth flow guiding hole set to undergo the second division. The at least one first temperature increasing member is configured to directly or indirectly increase the temperature of at least one of the first flow guiding member, the second flow guiding member and the third flow guiding member, so that the environmental temperature in the ductway of the flow guiding portion is within a first temperature range. The first temperature range is higher than the boiling-point temperature of the exhaust. The flow control portion has a side connectable to and communicatable with the flow guiding portion and has a second temperature increasing member therein. The second temperature increasing member is configured to increase the temperature of the flow control portion so that the environmental temperature in the ductway of the flow control portion is within a second temperature range, and the second temperature range is higher than the boiling-point temperature of the exhaust. The out-flowing gas guiding portion is connectable to and communicatable with the other side of the flow control portion, has a negative-pressure state therein, and includes at least one third temperature increasing member, a heat retention material layer and a gas outlet. The at least one third temperature increasing member is configured to increase the temperature of the out-flowing gas guiding portion, so that the environmental temperature in the ductway of the out-flowing gas guiding portion is within a third temperature range. The third temperature range is higher than the boiling-point temperature of the exhaust. The heat retention material layer is configured to isolate the thermal energy generated by temperature increasing by the at least one third temperature increasing member from the outside. The gas outlet is configured to allow the exhaust flowing out of the out-flowing gas guiding portion to be discharged into a piece of exhaust treatment equipment.

Certain aspects of the present disclosure are directed to an exhaust discharging method having a temperature control and heat retention mechanism for preventing photoresist from crystallization that causes duct adhesion, applicable to an exhaust discharging device, and including steps of: guiding photoresist-containing exhaust from a piece of process equipment to a flow guiding portion so that the exhaust sequentially flows through a first flow guiding member, a second flow guiding member and a third flow guiding member of the flow guiding portion, wherein the first flow guiding member has a first flow guiding hole set, the second flow guiding member has a plurality of rows of second flow guiding hole sets along a vertical-axis direction for the exhaust to flow through the second flow guiding hole sets to undergo the first division, the third flow guiding member has a third flow guiding hole set and a fourth flow guiding hole set and the third flow guiding hole set is spaced apart from the fourth flow guiding hole set with a distance so that the exhaust flows through the third flow guiding hole set and the fourth flow guiding hole set to undergo the second division, at least one first temperature increasing member of the flow guiding portion is configured to directly or indirectly increase the temperature of at least one of the first flow guiding member, the second flow guiding member and the third flow guiding member, so that the environmental temperature in the ductway of the flow guiding portion is within a first temperature range, and the first temperature range is higher than the boiling-point temperature of the exhaust; guiding the exhaust flowing out of the flow guiding portion into a flow control portion, and regulating the flow rate of the exhaust flowing through the flow control portion by adjusting and controlling the degree of openness of a valve set, wherein the flow control portion has a second temperature increasing member therein, the second temperature increasing member is configured to directly or indirectly increase the temperature of the exhaust in the flow control portion so that the environmental temperature in the ductway of the flow control portion is within a second temperature range, and the second temperature range is higher than the boiling-point temperature of the exhaust; and guiding the exhaust flowing out of the flow control portion into an out-flowing gas guiding portion, wherein the out-flowing gas guiding portion is in a negative-pressure state and includes at least one third temperature increasing member and a gas outlet, the at least one third temperature increasing member is configured to directly or indirectly increase the temperature of the exhaust in the out-flowing gas guiding portion, so that the environmental temperature in the ductway of the out-flowing gas guiding portion is within a third temperature range, the third temperature range is higher than the boiling-point temperature of the exhaust, the out-flowing gas guiding portion has a heat retention material layer to block cold air outside from direct contact with the out-flowing gas guiding portion so that the environmental temperature in the ductway of the out-flowing gas guiding portion is kept within a third temperature range, and the gas outlet is configured to guide the exhaust into a piece of exhaust treatment equipment.

In summary of the above, the exhaust discharging device with the temperature control and heat retention mechanism for preventing photoresist from crystallization that causes duct adhesion and its exhaust discharging method according to the present disclosure can improve the air temperature control, thermal insulation capacity, air flow uniformity and temperature monitoring in the ducts in the system, and adjust the optimal temperature and energy consumption balance point according to different photoresists, effectively improving on the crystallization problem of an exhaust discharging device, achieving the maximum energy saving benefits, so as to avoid duct crystallization problems caused by photoresist emission.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

FIG. 4 is a flowchart of an exhaust discharging method according to certain embodiments of the present disclosure.

DETAILED DESCRIPTION

Figure 1A:
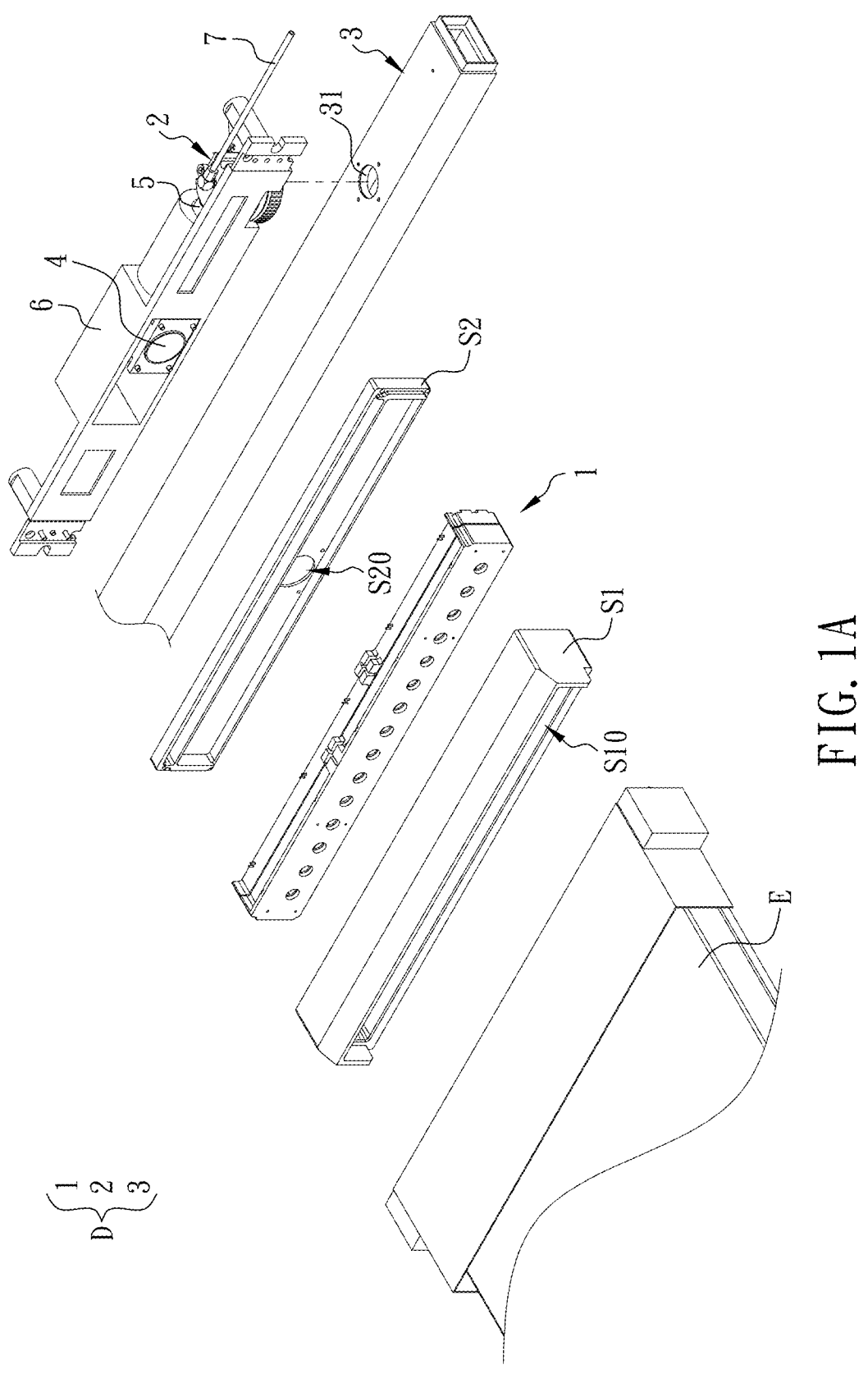
FIG. 1A is an exploded partial view of a piece of process equipment, and a first metal housing, a second metal housing and an exhaust discharging device according to certain embodiments of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The accompanying drawings are schematic and may not have been drawn to scale. The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, materials, objects, or the like, which are for distinguishing one component/material/object from another one only, and are not intended to, nor should be construed to impose any substantive limitations on the components, materials, objects, or the like. Directional terms (e.g., "front", "rear", "left", "right", "upper/top" and/or "lower/bottom") are explanatory only and are not intended to be restrictive of the scope of the present disclosure.

As used herein, a numeral value referred to in the present disclosure can include a value, or an average of values, in an acceptable deviation range of a particular value recognized or decided by a person of ordinary skill in the art, taking into account any specific quantity of errors related to the measurement of the value that may result from limitations of a measurement system or device. For example, a particular numeral value referred to in the embodiments of the present disclosure can include ±5%, ±3%, ±1%, ±0.5% or ±0.1%, or one or more standard deviations, of the particular numeral value.

Figure 2:
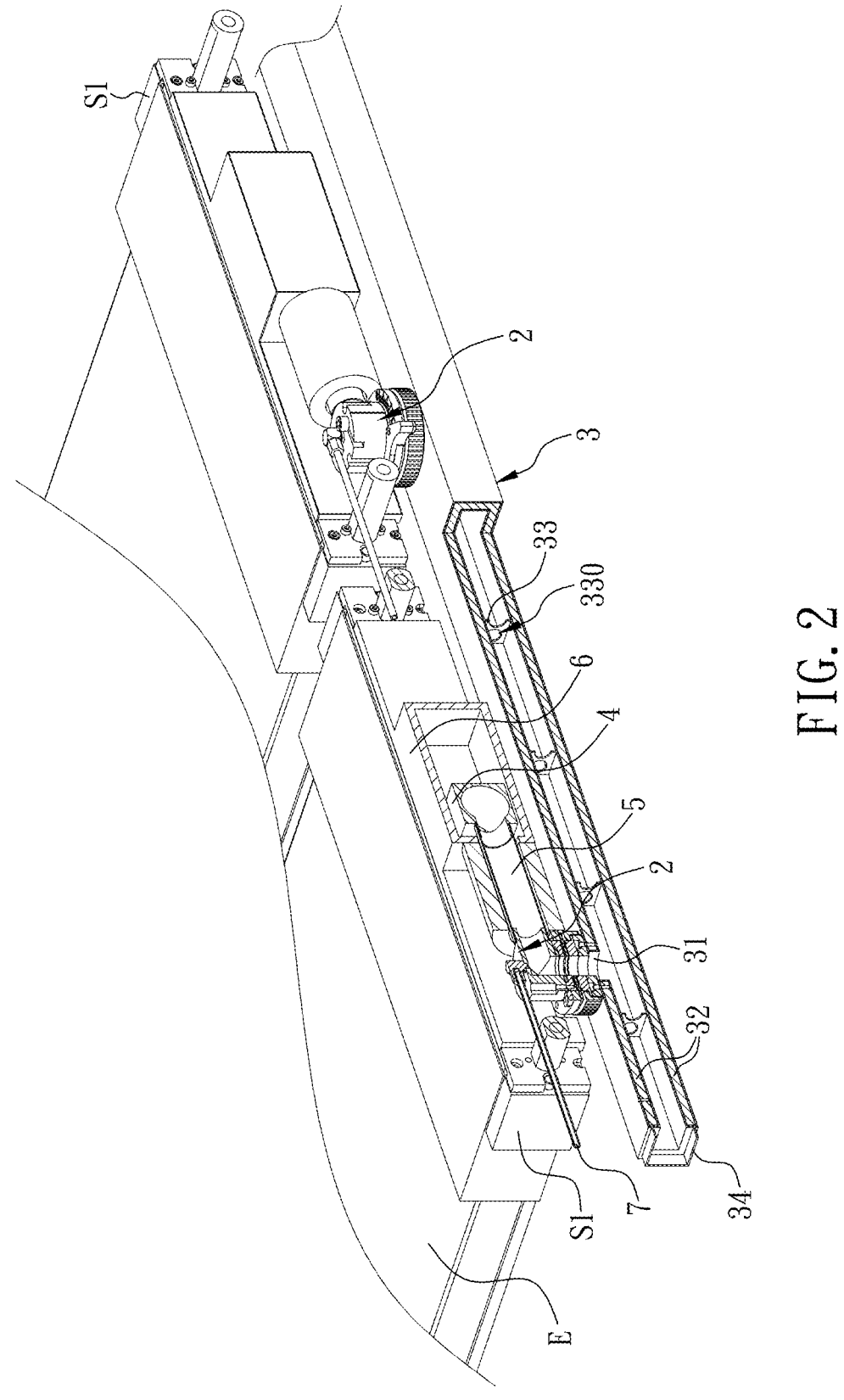
FIG. 2 is a perspective view of a vertical cross section of the rear side of a flow control portion and an out-flowing gas guiding portion according to certain embodiments of the present disclosure.

Certain aspects of the present disclosure are directed to an exhaust discharging device with a temperature control and heat retention mechanism for preventing photoresist from crystallization that causes duct adhesion. Referring to FIG. 1A, in certain embodiments, an exhaust discharging device D includes a flow guiding portion 1, a flow control portion 2, and an out-flowing gas guiding portion 3. However, the present disclosure is not limited to those drawn in FIG. 1A. According to actual product requirements, in certain embodiments, the out-flowing gas guiding portion 3 can connect with a plurality of flow guiding portions 1 and a plurality of flow control portions 2 (as shown in FIG. 2). To facilitate description of the relative positions of respective elements, in the present disclosure, the lower left corner of FIG. 1A is defined as a position in front of an element, the upper right corner of FIG. 1A as a position behind an element, the upper left corner of FIG. 1A as a position on the left side of an element, the lower right corner of FIG. 1A as a position on the right side of an element, the top edge of FIG. 1A as a position on the upper side (the top side) of an element, and the bottom edge of FIG. 1A as a position on the lower side (the bottom side) of an element. Further, the transverse axis as referred to infra refers to a direction that extends between the upper left and the lower right of FIG. 1A, the longitudinal axis as referred to infra refers to a direction that extends between the lower left and the upper right of FIG. 1A, and the vertical axis as referred to infra refers to a top-bottom extending direction. Further, the ductway as referred to in the present invention refers to space for gas to flow therethrough, and said ductway is not limited to tubular space in a shape of a long strip. As used in the description herein and throughout the claims that follow, unless the context clearly dictates otherwise, the term "pipe" can be interchangeable with the term "tube", and includes reference to a pipe having a cross section that is round, oval, rectangular, square, etc., that is, the shape of the cross section of a pipe can vary and is not necessarily round as it can be adjusted according to product needs. In other words, the present disclosure is not limited to a certain pipe shape. In addition, the configuration of the exhaust discharging device D is not limited to those drawn in the drawings of the present disclosure, and the appearance and shape of each component can be adjusted according to product needs. Accordingly, as long as an exhaust discharging device has the relevant basic structure and effect in any following embodiment, it falls within the scope of the exhaust discharging device D defined in the present disclosure.

Figure 1B:
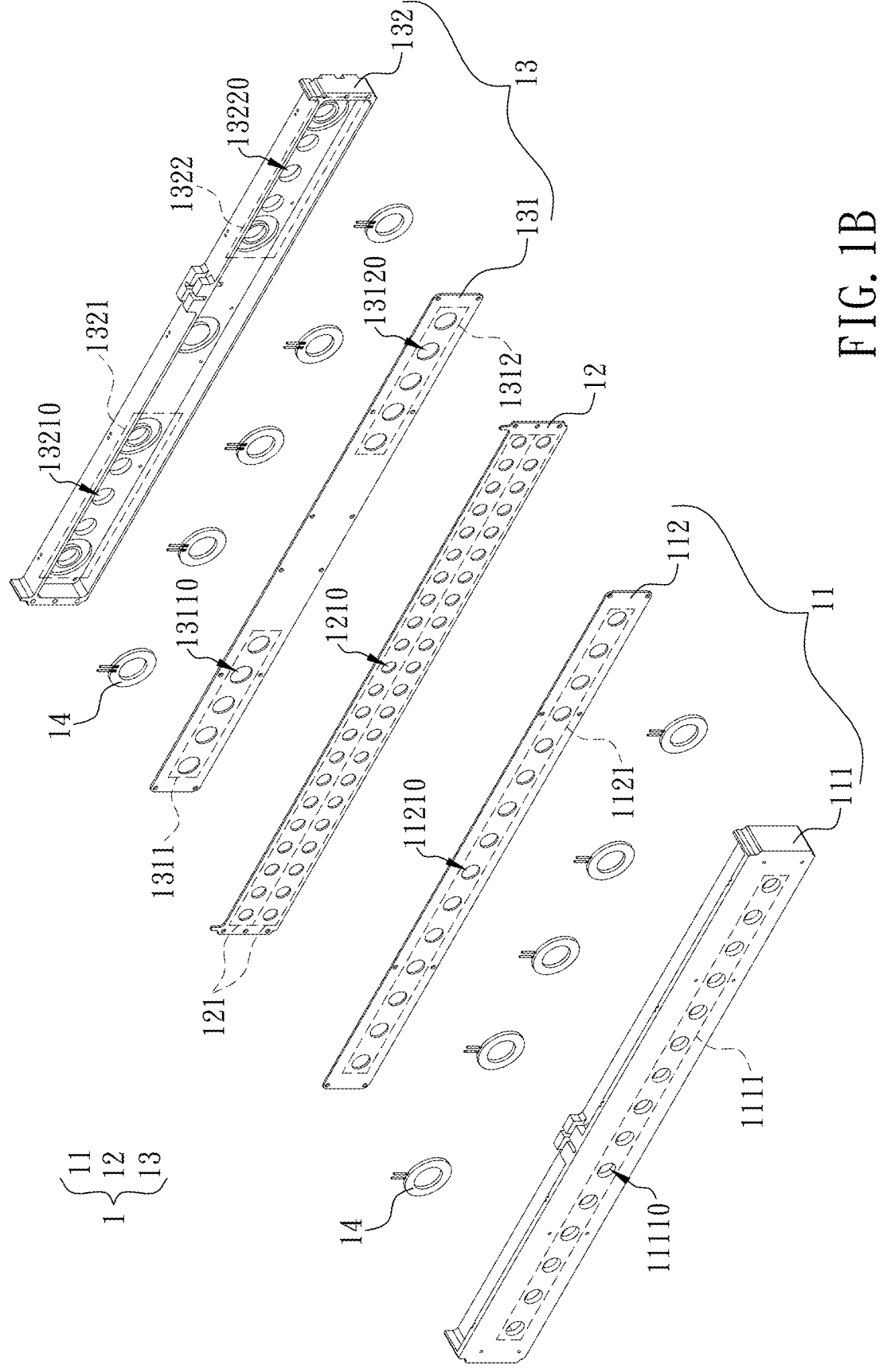
FIG. 1B is an exploded view of a flow guiding portion according to certain embodiments of the present disclosure.

Referring to FIG. 1A and FIG. 1B, the flow guiding portion 1 can connect with a piece of process equipment E (e.g., a wafer coating bake-plate apparatus), is made of a good conductor of heat (e.g., a metal material), and can be enclosed by and assembled in a first metal housing S1 and a second metal housing S2. The first metal housing S1 has a first through hole S10 penetrating its front and rear sides. The second metal housing S2 has a second through hole S20 penetrating its front and rear sides. The first through hole S10 has an elongated shape, the second through hole S20 has a circular shape, and the second metal housing S2 can engage and connect with the first metal housing S1. Photoresist-containing process exhaust is guided from the process equipment E into the flow guiding portion 1. The flow guiding portion 1 includes a first flow guiding member 11, a second flow guiding member 12, a third flow guiding member 13, and at least one first temperature increasing member 14. The first flow guiding member 11 includes a first flow guiding plate 111 and a second flow guiding plate 112, on which there is a first flow guiding hole set 1111, 1121. The first flow guiding hole set 1111, 1121 includes a plurality of first flow guiding holes 11110, 11210. The first flow guiding holes 11110 located at the first flow guiding plate 111 correspond to the first flow guiding holes 11210 located at the second flow guiding plate 112. The first flow guiding holes 11110 are arranged at equal intervals. The first flow guiding holes 11210 are arranged at equal intervals. The second flow guiding member 12 has two rows of second flow guiding hole sets 121 (however, the number of rows is not limited thereto), each of the second flow guiding hole sets 121 includes a plurality of second flow guiding holes 1210, and the second flow guiding hole sets 121 are vertically offset from the first flow guiding hole set 1111, 1121 alternatingly. The second flow guiding holes 1210 in the same row are arranged at equal intervals. In certain embodiments, the second flow guiding member 12 can have three rows, or more than three rows, of second flow guiding hole sets 121. As long as flow guiding hole sets have the configuration and number of rows that can produce a flow guiding effect in the vertical-axis direction, they fall within the scope of the configuration and number of rows of the second flow guiding hole sets 121 defined in the present disclosure. The third flow guiding member 13 includes a third flow guiding plate 131 and a fourth flow guiding plate 132, on which there are a third flow guiding hole set 1311, 1321 and a fourth flow guiding hole set 1312, 1322, respectively. The third flow guiding hole set 1311, 1321 and the fourth flow guiding hole set 1312, 1322 are at the same height when viewed horizontally and are spaced apart from each other by a distance, that is, the middle area of the third flow guiding member 13 is not provided with any flow guiding hole. Further, the third flow guiding hole set 1311, 1321 and the fourth flow guiding hole set 1312, 1322 respectively are vertically offset from the second flow guiding hole sets 121 alternatingly. The third flow guiding hole set 1311, 1321 includes a plurality of third flow guiding holes 13110, 13210. The fourth flow guiding hole set 1312, 1322 includes a plurality of fourth flow guiding holes 13120, 13220. Intervals are arranged between the third flow guiding holes 13110, 13210 and between the fourth flow guiding holes 13120, 13220. First temperature increasing members 14 can be respectively provided between the first flow guiding plate 111 and the second flow guiding plate 112 and between the third flow guiding plate 131 and the fourth flow guiding plate 132, and can be circumferentially provided around the peripheries of some of the first flow guiding holes 11110, 11210 and around the outer side of the peripheries of third flow guiding holes 13110, 13210 and/or the fourth flow guiding holes 13120, 13220. The first temperature increasing members 14 can lie against the rear side of the first flow guiding plate 111 and the front side of the fourth flow guiding plate 132, and the middle area of the third flow guiding member 13 (i.e., the position that separates the third flow guiding hole set 1311, 1321 from the fourth flow guiding hole set 1312, 1322) is provided with the first temperature increasing member(s) 14.

Figure 3:
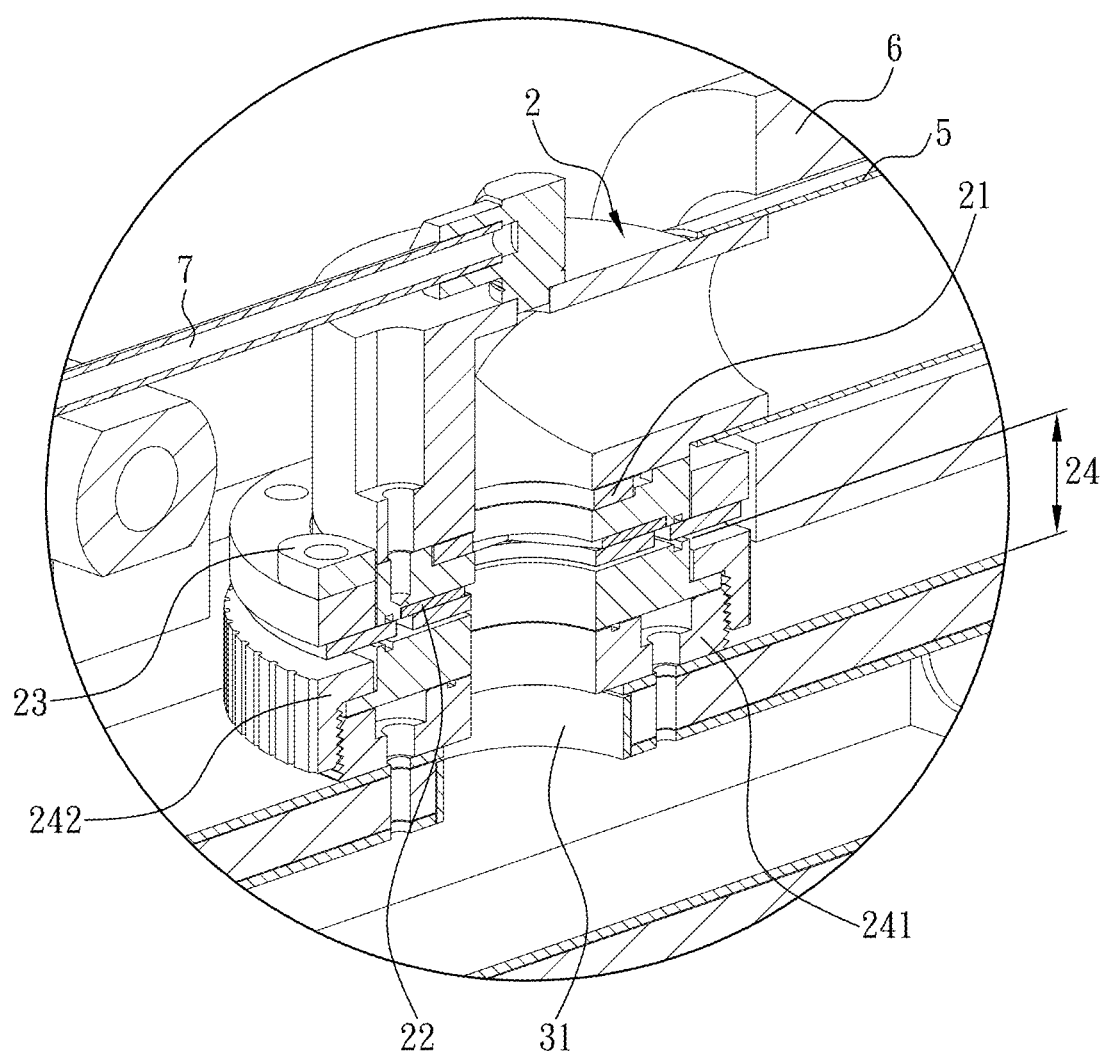
FIG. 3 is an enlarged perspective view of FIG. 2, showing the vertical cross section of the flow control portion.

Continued from the above, referring to FIG. 1A, FIG. 2, and FIG. 3, the flow guiding portion 1 can connect and be in communication with a side of a first metal connection port 4, and the other side of the first metal connection port 4 is connected with one end of a flow guiding duct 5. The flow guiding duct 5 can be made of a Teflon material. The outer side of the first metal connection port 4 and the outer side of the flow guiding duct 5 can be covered by a heat retention housing 6 to reduce the dissipation of thermal energy from the process exhaust flowing through the first metal connection port 4 and the flow guiding duct 5. The other end of the flow guiding duct 5 connects and is in communication with one side of the flow control portion 2. The flow control portion 2 has therein a second temperature increasing member 21, includes a valve set 22, an adjustment handle 23, and a connection base 24, and can connect with a duct 7. The second temperature increasing member 21 can directly increase the temperature of the ductway of the flow control portion 2 so that the environmental temperature in the ductway of the flow control portion 2 is within a second temperature range, and the second temperature range is higher than the boiling-point temperature of the process exhaust. The valve set 22 is made of metal members and includes a plurality of valve flaps (not shown in the figure). The adjustment handle 23 can adjust and control the degree of openness of the valve set 22. The adjustment handle 23 can be made of an insulating material, and accordingly a user, when operating the adjustment handle 23, will not be affected by the temperature increasing by the second temperature increasing member 21 and the high-temperature state of the valve set 22 and have burn injury. The connection base 24 can connect with a second metal connection port 31 of the out-flowing gas guiding portion 3 and includes a fixed member 241 and a rotating ring 242. The fixed member 241 can be fixed on the out-flowing gas guiding portion 3 and threadedly connect with the rotating ring 242. When a user rotates the rotating ring 242, all the other portion(s) of the flow control portion 2 except for the fixed base 241 can be separated from the out-flowing gas guiding portion 3, without having to remove any fixing elements (e.g., screws) one by one, achieving a quick-release effect, and valid data (e.g., temperature, flow rate, etc.) generated by opening/closing the flow control portion 2 can be collected through the duct 7.

Referring again to FIG. 1A and FIG. 2, the out-flowing gas guiding portion 3 can connect and be in communication with the other side of the flow control portion 2, is a duct, is in a negative-pressure state internally (e.g., with an internal pressure of −20 Pa), and can connect with a gas extraction device. The out-flowing gas guiding portion 3 includes a heat retention material layer 32 and has at least one third temperature increasing member 33 and a gas outlet 34. The heat retention material layer 32 is formed by placing an aerogel thermal insulation layer between two layers of stainless-steel structure such that the duct wall of the out-flowing gas guiding portion 3 has an extremely low thermal conductivity coefficient (e.g., 0.023 W/mK) to effectively block thermal conduction and thereby achieve a good heat retention effect. The inner wall surface of the out-flowing gas guiding portion 3 can be coated with a Teflon material to enhance the effect of preventing photoresist from adhering to the duct wall. In certain embodiments, the out-flowing gas guiding portion 3 can be provided with a plurality of third temperature increasing members 33 arranged at intervals (but not limited thereto). The third temperature increasing members 33 can be provided with a plurality of communication holes 330 so that the process exhaust can flow through the communication holes 330. When the third temperature increasing member(s) 33 increases the temperature of the out-flowing gas guiding portion 3, the environmental temperature in the ductway of the out-flowing gas guiding portion 3 can be brought within a third temperature range, and the third temperature range is higher than the boiling-point temperature of the process exhaust. Moreover, the heat retention material layer 32 can isolate the thermal energy generated by the temperature increasing by the third temperature increasing member(s) 33 from the cold air outside, preventing the internal temperature of the out-flowing gas guiding portion 3 from lowering, so that the process exhaust flowing through the out-flowing gas guiding portion 3 can be smoothly guided by the gas outlet 34 and discharged into a piece of exhaust treatment equipment. In certain embodiments, the out-flowing gas guiding portion 3 can be provided with only one third temperature increasing member 33 and use the heat retention property of the heat retention material layer 32 to maintain the internal temperature of the out-flowing gas guiding portion 3 to be within the third temperature range. Besides, in certain embodiments, the exhaust discharging device D is further provided with a plurality of thermocouples, in particular K-type thermocouples, whose range of measurement is from −200 degrees Celsius (−200° C.) to 1000° C., and whose sensitivity is 41 μV/° C. The provision of the thermocouples allows the value of the temperature inside the exhaust discharging device D to be monitored in real time, and the heating power of the first temperature increasing member(s) 14, of the second temperature increasing member 21, and of the third temperature increasing member(s) 33 can be adjusted according to the temperature value measured.

Referring to FIG. 4, the exhaust discharging method of the exhaust discharging device D includes the following steps:

Step P01: The photoresist-containing process exhaust sent from the process equipment E is guided into the flow guiding portion 1 and goes through two flow dividing processes to mix the process exhaust thoroughly.

The process exhaust emitted by the process equipment E first flows through the first through hole S10 into the first metal housing S1, flows through the first flow guiding hole set 1111, 1121 of the first flow guiding member 11, and flows out of the first flow guiding member 11 through the first flow guiding holes 11110, 11210 of the first flow guiding hole set 1111, 1121; next, flows through the second flow guiding hole sets 121 of the second flow guiding member 12, the second flow guiding hole sets 121, which are vertically offset from the first flow guiding hole set 1111, 1121 alternatingly, dividing the process exhaust for the first time in the vertical-axis direction and guiding the process exhaust out of the second flow guiding member 12 through the second flow guiding holes 1210; and next, flows sequentially through the third flow guiding hole set 1311, 1321 and the fourth flow guiding hole set 1312, 1322 of the third flow guiding member 13, the third flow guiding hole set 1311, 1321 and the fourth flow guiding hole set 1312, 1322, which are vertically offset from the second flow guiding hole sets 121 alternatingly and are spaced apart from each other by a distance, respectively dividing the process exhaust for the second time in the transverse-axis direction and guiding the process exhaust out of the third flow guiding member 13 through the third flow guiding holes 13110, 13210 and the fourth flow guiding holes 13120, 13220. Lastly, the process exhaust flowing out of the third flow guiding member 13 converges toward the middle area of the second metal housing S2 and flows out of the second metal housing S2 through the second through hole S20. When the first temperature increasing member(s) 14 directly or indirectly increases the temperature of the process exhaust flowing through the first flow guiding member 11, the second flow guiding member 12, and/or the third flow guiding member 13 and thereby bring the environmental temperature in the ductway of the flow guiding portion 1 within the first temperature range, the flow guiding portion 1, as being made of a good conductor of heat, can through its good thermal conductivity transmit thermal energy from areas adjacent to the first temperature increasing member(s) 14 to the entirety of the first flow guiding plate 111 and of the fourth flow guiding plate 132 (i.e., to areas away from the first temperature increasing member(s) 14) rapidly and directly, and indirectly to the entirety of the second flow guiding plate 112, of the second flow guiding member 12, and of the third flow guiding plate 131 (i.e., to the entire elements that are not directly connected to the first temperature increasing member(s) 14). The first temperature range is higher than the boiling-point temperature of the process exhaust (e.g., 120° C.). The first temperature increasing members 14 lie close to the flow guiding holes 11110, 11210, 1210, 13110, 13120, 13210, 13220 so that the photoresist in the process exhaust will not adhere to the inner side of the peripheries of the first flow guiding holes 11110, 11210, of the second flow guiding holes 1210, of the third flow guiding holes 13110, 13210, and of the fourth flow guiding holes 13120, 13220, thereby preventing the duct walls from being clogged.

Step P02: Guiding the process exhaust into the flow control portion 2, and regulating the flow rate of the process exhaust flowing out of the flow control portion 2.

Once the process exhaust is guided from the flow guiding portion 1 into the flow control portion 2, the second temperature increasing member 21 directly or indirectly increases the temperature of the process exhaust flowing through the flow control portion 2. After the increase of temperature, the environmental temperature in the ductway of the flow control portion 2 is in the second temperature range, and the second temperature range is higher than the boiling-point temperature of the process exhaust. The flow control portion 2 also regulates the flow rate of the process exhaust flowing out of the flow control portion 2 through adjusting and controlling the degree of openness of the valve set 22 and guides the process exhaust out of the flow control portion 2.

Step P03: Guiding the process exhaust flowing out of the flow control portion 2 into the out-flowing gas guiding portion 3 and then guiding the process exhaust into the exhaust treatment equipment through the gas outlet 34.

The process exhaust is guided from the flow control portion 2 into the out-flowing gas guiding portion 3. The third temperature increasing members 33, which are arranged at intervals, directly or indirectly increase the temperature of the process exhaust in the out-flowing gas guiding portion 3, and after the increase of temperature, the environmental temperature in the ductway of the out-flowing gas guiding portion 3 is in the third temperature range. The third temperature range is higher than the boiling-point temperature of the process exhaust, and the cold air outside is blocked out by the heat retention material layer 32 and kept from direct contact with the interior of the out-flowing gas guiding portion 3, so that the environmental temperature inside the out-flowing gas guiding portion 3 can stay in the third temperature range. After the first temperature increasing member(s) 14, the second temperature increasing member 21, and the third temperature increasing member(s) 33 respectively carry out temperature increasing, so that the environmental temperatures in the flow guiding portion 1, in the flow control portion 2, and in the out-flowing gas guiding portion 3 are in the first temperature range, the second temperature range, and the third temperature range, respectively, the photoresist contained in the process exhaust can be kept from forming crystals and causing adhesion inside the ductway of the exhaust discharging device D. Lastly, the process exhaust in the out-flowing gas guiding portion 3 is guided into the exhaust treatment equipment. Accordingly, the exhaust discharging device D in the present disclosure, through the cartridge-type assembly design (i.e., with the three flow guiding members 11, 12, 13 assembled in the first metal housing S1 and the second metal housing S2) and the temperature-controllable method, allows the front section of the exhaust discharging device D (i.e., the flow guiding portion 1) to have an optimized flow field and the property of being able to increase the temperature of process exhaust, reduces the dissipation of thermal energy, and achieves an energy-saving effect; allows the middle section of the exhaust discharging device D (i.e., the flow control portion 2) to have the property of serving as an adapter, controlling flow velocity and increasing temperature; and allows the last section of the exhaust discharging device D (i.e., the out-flowing gas guiding portion 3) to have a heat retention design, enables an increasingly mild gradient of temperature reduction, and can maintain a temperature higher than the boiling-point temperature of the process exhaust.

To prove that the technical means of the exhaust discharging device D in the present disclosure are indeed effective in preventing the photoresist contained in process exhaust from crystallization that causes adhesion to the ductway of the exhaust discharging device D, experimental data is provided as follows, corroborating the superiority of the exhaust discharging device D over the conventional exhaust equipment. Referring to Table 1 below, the control group refers to a configuration in which only electric heating wires were used to cover the outer side of the first metal housing S1 and a temperature increasing process was performed on the flow guiding portion 1; experimental group 1 used the exhaust discharging device D in the present disclosure to perform the three-stage heating process of the flow guiding portion 1, the flow control portion 2, and the out-flowing gas guiding portion 3; and the thermal equilibrium time of the control group and the thermal equilibrium time of the experimental group 1 were both two hours or more. Table 1 presents the temperature values measured and the crystallization state when only the temperature of the flow guiding portion 1 was increased with comparison to when the exhaust discharging device D was provided with the first temperature increasing member(s) 14, the second temperature increasing member 21, and the third temperature increasing member(s) 33.

TABLE 1

| | Distance from the position where temperature was measured to second metal connection port 31 (centimeters (cm)) | | | | | | Crystal-lization state on inner wall surface of out-flowing gas |
| --- | --- | --- | --- | --- | --- | --- | --- |
| | 0 cm | 10 cm | 20 cm | 30 cm | 40 cm | 50 cm | guiding portion 3 |
| | Temperature value measured (° C.) | | | | | | |
| Control group | 81.7 | 78.4 | 74.7 | 71.2 | 68.5 | 66.3 | Yes |
| Experimental group 1 | 146.9 | 141.1 | 139.8 | 138.0 | 135.1 | 133.3 | No |

It can be known from the contents of Table 1 that the control group was like conventional exhaust equipment in that ordinarily only the front section of the equipment was heated. When process exhaust heated in this way was guided into the gas outlet duct (i.e., the last section of the equipment), it can be found from the experimental results that the control group had the problem that the internal temperature of the last section of the equipment was lower than the boiling-point temperature of the process exhaust (e.g., the boiling-point temperature of the photoresist was 120° C.), and as a result, crystals were formed on the inner wall surface of the last section of the equipment and blocked the ductway. However, the exhaust discharging device D in the present disclosure was provided with temperature increasing members in the front section (i.e., the flow guiding portion 1), the middle section (i.e., the flow control portion 2), and the last section (i.e., the out-flowing gas guiding portion 3) and used the heat retention housing 6 and the heat retention material layer 32 to reduce the dissipation of thermal energy. It can be known from the experimental results of experimental group 1 that not only were the temperatures of the low-temperature areas of the out-flowing gas guiding portion 3 (i.e., areas away from the second metal connection port 31) still higher than the boiling-point temperature of the process exhaust, but also tail gas crystallization did not occur. The exhaust discharging device D of the present invention can completely improve on problems arising from the adhesion of photoresist to ductway, thereby smoothly discharging process exhaust to exhaust treatment equipment.

In addition, the exhaust discharging device D in the present disclosure is provided with the flow control portion 2. Not only can the flow control portion 2 control the flow rate of process exhaust, but also whether or not the second temperature increasing member 21 in the flow control portion 2 carries out heating has a great impact on whether or not crystals will form in the ductway of the exhaust discharging device D. Referring to Table 2 below, the control group used the exhaust discharging device D in the present disclosure to perform the three-stage heating process of the flow guiding portion 1, the flow control portion 2 and the out-flowing gas guiding portion 3, and was provided with the heat retention housing 6, and the heat retention material layer 32; in experimental group 2, the heating function of the second temperature increasing member 21 was turned off while the first temperature increasing member(s) 14, the heat retention housing 6, the third temperature increasing member(s) 33, and the heat retention material layer 32 were still provided; and in experimental group 3, the heating function of the second temperature increasing member 21 was turned off, the heat retention housing 6 was not provided, and yet the first temperature increasing member(s) 14, the third temperature increasing member(s) 33, and the heat retention material layer 32 remained. The thermal equilibrium time of the afore-referenced control group, of the afore-referenced experimental group 2, and of the afore-referenced experimental group 3 was all two hours or more. Table 2 presents the temperature values measured and the crystallization state when the heat retention housing 6, the flow control portion 2, and the heat retention material layer 32 were provided.

TABLE 2

| | Distance from the position where temperature was measured to second metal connection port 31 (cm) | | | | | | Crystallization state on inner wall surface of out-flowing gas guiding portion 3 |
| | 0 cm | 10 cm | 20 cm | 30 cm | 40 cm | 50 cm | |
| | Temperature value measured (° C.) | | | | | | |
| Control group | 146.9 | 141.1 | 139.8 | 138.0 | 135.1 | 133.3 | No |
| Experimental group 2 | 104.5 | 97.8 | 96.7 | 94.9 | 95.8 | 94.1 | Some |
| Experimental group 3 | 85.9 | 80.9 | 80.4 | 79.1 | 79.5 | 78.8 | Yes |

It can be known from the contents of Table 2 that when the heating function of the second temperature increasing member 21 was turned off or the flow control portion 2 was not heated, the internal temperature of the out-flowing gas guiding portion 3 significantly lowered. As the temperature range of experimental group 2 was lower than the boiling-point temperature of the photoresist, some photoresist crystals adhered to the inner wall surface of the out-flowing gas guiding portion 3. When the heating function of the second temperature increasing member 21 was turned off or the flow control portion 2 was not heated, and the outer side of the first metal connection port 4 connected between the flow guiding portion 1 and the flow control portion 2 and the outer side of the flow guiding duct 5 were not provided with the heat retention housing 6, the thermal energy in the exhaust discharging device D was dissipated to the outside to a great extent through thermal conduction such that the internal temperature of the out-flowing gas guiding portion 3 was significantly lower than the boiling-point temperature of the photoresist. The experimental result of the experimental group 3 is that many photoresist crystals adhered to the inner wall surface of the out-flowing gas guiding portion 3. Therefore, the flow control portion 2 provided with the second temperature increasing member 21 not only can regulate the flow rate of the process exhaust flowing therethrough, but also can provide thermal energy to the process exhaust to prevent the process exhaust flowing through the flow control portion 2 and having the thermal energy from exchanging heat with the cold air outside the exhaust discharging device D, which would have caused the temperature of the process exhaust flowing into the out-flowing gas guiding portion 3 to be greatly reduced. Meanwhile, the provision of the heat retention housing 6 and the heat retention material layer 32 can also keep the internal temperature of the exhaust discharging device D higher than the boiling-point temperature of the process exhaust, thereby achieving the effect of preventing tail gas crystallization.

In summary of the above, through the exhaust discharging device D and its exhaust discharging method in the present disclosure, flow division can be performed twice on the process exhaust flowing through the flow guiding portion 1; and once the process exhaust is thoroughly mixed and has its temperature increased, and in order to maintain the negative-pressure state of the out-flowing gas guiding portion 3, the degree of openness of the valve set 22 of the flow control portion 2 can be adjusted and controlled to precisely control the flow rate of the process exhaust so that the gas extraction device connected to the out-flowing gas guiding portion 3 can increase or decrease its gas extraction pressure according to the flow rate of the process exhaust (i.e., the gas extraction pressure will be high when the process exhaust has a high flow rate, and the gas extraction pressure will be low when the process exhaust has a low flow rate). The structure in which the flow guiding portion 1, the flow control portion 2, and the out-flowing gas guiding portion 3 are provided with the temperature increasing members 14, 21, 33, in which the connection portion between the flow guiding portion 1 and the flow control portion 2 is covered with the heat retention housing 6, and in which the out-flowing gas guiding portion 3 is provided with the heat retention material layer 32 allows the temperature range of process exhaust to be able to be always kept higher than the boiling point of the process exhaust during the entire exhaust discharging process of the exhaust discharging device D, so as to effectively prevent the photoresist ingredient contained therein from forming crystals during the exhaust discharging process, and to effectively realize the effect of preventing such crystals from adhering in the exhaust discharging device D.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An exhaust discharging device with a temperature control and heat retention mechanism for preventing photoresist from crystallization and from causing duct adhesion, comprising:

a flow guiding portion that is connectable to and communicatable with a piece of process equipment, is made of a good conductor of heat, is for photoresist-containing exhaust to be guided from the process equipment into ductway of the flow guiding portion, and comprises:

a first flow guiding member having a first flow guiding hole set for the exhaust to flow therethrough;

a second flow guiding member having a plurality of rows of second flow guiding hole sets along a vertical-axis direction for the exhaust to flow therethrough to undergo a first division;

a third flow guiding member having a third flow guiding hole set and a fourth flow guiding hole set, wherein the third flow guiding hole set is spaced apart from the fourth flow guiding hole set with a distance, and the exhaust flows through the third flow guiding hole set and the fourth flow guiding hole set to undergo a second division; and at least one first temperature increasing member configured to directly or indirectly increase a temperature of at least one of the first flow guiding member, the second flow guiding member and the third flow guiding member, so that an environmental temperature in ductway of the flow guiding portion is within a first temperature range, wherein the first temperature range is higher than a boiling-point temperature of the exhaust;

a flow control portion having a side connectable to and communicatable with the flow guiding portion and having a second temperature increasing member therein, wherein the second temperature increasing member is configured to increase a temperature of the flow control portion so that an environmental temperature in ductway of the flow control portion is within a second temperature range, and the second temperature range is higher than the boiling-point temperature of the exhaust; and an out-flowing gas guiding portion connectable to and communicatable with the other side of the flow control portion, having a negative-pressure state therein, and comprising:

at least one third temperature increasing member configured to increase a temperature of the out-flowing gas guiding portion, so that an environmental temperature in ductway of the out-flowing gas guiding portion is within a third temperature range, wherein the third temperature range is higher than the boiling-point temperature of the exhaust;

a heat retention material layer configured to isolate thermal energy generated by temperature increasing by the at least one third temperature increasing member from the outside; and a gas outlet configured to allow the exhaust flowing out of the out-flowing gas guiding portion to be discharged into a piece of exhaust treatment equipment.

2. The exhaust discharging device according to claim 1, wherein the first flow guiding hole set includes a plurality of first flow guiding holes, the plurality of first flow guiding holes are arranged at intervals, each of the second flow guiding hole sets includes a plurality of second flow guiding holes, the plurality of second flow guiding holes are arranged at intervals, the third flow guiding hole set includes a plurality of third flow guiding holes, the fourth flow guiding hole set includes a plurality of fourth flow guiding holes, the plurality of third flow guiding holes are arranged at intervals, and the plurality of fourth flow guiding holes are arranged at intervals.

3. The exhaust discharging device according to claim 1, wherein the heat retention material layer is of an aerogel material.

4. The exhaust discharging device according to claim 1, wherein the flow guiding portion is enclosed by and assembled in a first metal housing and a second metal housing, the first metal housing is configured to be engaged and connected with the second metal housing, the first metal housing has a first through hole, the second metal housing has a second through hole, and the exhaust is guided into the flow guiding portion through the first through hole, and flows into the flow control portion through the second through hole after flowing out of the flow guiding portion.

5. The exhaust discharging device according to claim 1, wherein an outer side of a connection portion between the flow guiding portion and the flow control portion is covered with a heat retention housing to block thermal conduction of the exhaust flowing through the connection portion with cold air outside.

6. The exhaust discharging device according to claim 1, wherein an inner wall surface of the out-flowing gas guiding portion is coated with Teflon.

7. An exhaust discharging method having a temperature control and heat retention mechanism for preventing photoresist from crystallization and from causing duct adhesion, applicable to an exhaust discharging device, and comprising steps of:

guiding photoresist-containing exhaust from a piece of process equipment to a flow guiding portion so that the exhaust sequentially flows through a first flow guiding member, a second flow guiding member and a third flow guiding member of the flow guiding portion, wherein the first flow guiding member has a first flow guiding hole set, the second flow guiding member has a plurality of rows of second flow guiding hole sets along a vertical-axis direction for the exhaust to flow through the second flow guiding hole sets to undergo a first division, the third flow guiding member has a third flow guiding hole set and a fourth flow guiding hole set and the third flow guiding hole set is spaced apart from the fourth flow guiding hole set with a distance so that the exhaust flows through the third flow guiding hole set and the fourth flow guiding hole set to undergo a second division, at least one first temperature increasing member of the flow guiding portion is configured to directly or indirectly increase a temperature of at least one of the first flow guiding member, the second flow guiding member and the third flow guiding member, so that an environmental temperature in ductway of the flow guiding portion is within a first temperature range, and the first temperature range is higher than a boiling-point temperature of the exhaust;

guiding the exhaust flowing out of the flow guiding portion into a flow control portion, and regulating a flow rate of the exhaust flowing through the flow control portion by adjusting and controlling a degree of openness of a valve set, wherein the flow control portion has a second temperature increasing member therein, the second temperature increasing member is configured to directly or indirectly increase a temperature of the exhaust in the flow control portion so that an environmental temperature in ductway of the flow control portion is within a second temperature range, and the second temperature range is higher than the boiling-point temperature of the exhaust; and guiding the exhaust flowing out of the flow control portion into an out-flowing gas guiding portion, wherein the out-flowing gas guiding portion is in a negative-pressure state and includes at least one third temperature increasing member and a gas outlet, the at least one third temperature increasing member is configured to directly or indirectly increase a temperature of the exhaust in the out-flowing gas guiding portion, so that an environmental temperature in ductway of the out-flowing gas guiding portion is within a third temperature range, the third temperature range is higher than the boiling-point temperature of the exhaust, the out-flowing gas guiding portion has a heat retention material layer to block cold air outside from direct contact with the out-flowing gas guiding portion so that the environmental temperature in the ductway of the out-flowing gas guiding portion is kept within the third temperature range, and the gas outlet is configured to guide the exhaust into a piece of exhaust treatment equipment.

* * * * *